United States Patent [19]

Hamajima et al.

[11] Patent Number: 5,985,681
[45] Date of Patent: Nov. 16, 1999

[54] METHOD OF PRODUCING BONDED SUBSTRATE WITH SILICON-ON-INSULATOR STRUCTURE

[75] Inventors: Tomohiro Hamajima; Hiroaki Kikuchi, both of Tokyo, Japan

[73] Assignee: NEC Corporation, Tokyo, Japan

[21] Appl. No.: 08/937,009

[22] Filed: Sep. 24, 1997

Related U.S. Application Data

[62] Division of application No. 08/730,549, Oct. 15, 1996.

[30] Foreign Application Priority Data

Oct. 13, 1995 [JP] Japan ..................... 7-265736

[51] Int. Cl.$^6$ .............................................. H01L 21/3065
[52] U.S. Cl. .............................. 438/8; 438/406; 438/459; 438/977
[58] Field of Search ................................ 438/8, 406, 459, 438/977, FOR 222

[56] References Cited

U.S. PATENT DOCUMENTS 5,164,218  11/1992  Tsuruta et al. .
5,313,092  5/1994   Tsuruta et al. .
5,529,947  6/1996   Okonogi .

FOREIGN PATENT DOCUMENTS 2-219266   8/1990   Japan .
3-142952   6/1991   Japan .
4-29353    1/1992   Japan .

Primary Examiner—George Fourson
Attorney, Agent, or Firm—Foley & Lardner

[57] ABSTRACT

Two wafers of single-crystal silicon are used to produce a bonded substrate having a silicon-on-insulator (SOI) structure. In a principal surface of a first wafer, a number of first insulator film patterns of equal thickness art formed for isolation of semiconductor devices to be fabricated on the bonded substrate. Simultaneously, at least to second insulator film patterns having the same thickniess as the first insulator film patterns are formed in the same surface of the first wafer for optical measurement of the thickness of an active layer of in the bonded substrate. Then the first wafer is bonded to a second wafer to obtain a bonded substrate in which the insulator film patterns are buried adjacent to the interface between the two silicon wafers. To form an active layer having a desired thickness above the buried insulator film patterns, the thickness of the first wafer is reduced by mechanical grinding and chemical-mechanical polishing. The polishing operation is intermitted at suitable time intervals, and the thickness of the active layer is measured by an optical method in the area of each of the second insulator film patterns while the polishing operation is intermitted.

30 Claims, 5 Drawing Sheets

METHOD OF PRODUCING BONDED SUBSTRATE WITH SILICON-ON-INSULATOR STRUCTURE

This application is a division of application Ser. No. 08/730,549, filed Oct. 15, 1996.

BACKGROUND OF THE INVENTION

This invent ion relates to a bonded substrate with a silicon-on-insulator (SOI) structure for the fabrication of semiconductor devices and a method of producing the bonded substrate.

In the semiconductor industry the use of bonded SOI substrates having a buried insulator layer such as a silicon oxide layer is expanding. Particularly in the field of power ICs, the use of bonded substrates having a local SOI structure has been developed to meet the requirements of enlarging the scale of integration and enhancing the withstand voltage by fabricating a high voltage MOSFET of the vertical type and low voltage control circuit components in a single chip. The low voltage components, i.e., devices, are fabricated in a region above a buried insulator layer and the high voltage device in another region wherein no insulator layer is buried.

For example, JP-A 4-29353 shows the use of a bonded substrate with a local SOI stricture in a power IC. As shown in FIG. 4 of the accompanying drawings, a first single-crystal silicon wafer 30 is bonded to a second single-crystal silicon wafer 30. Before bonding the two wafers 30 and 50, a silicon oxide film 32 is formed in a principal surface of the first wafer 30. In the bonded substrate the oxide film 32 is buried adjacent to the bonding plane 52. The thickness of the first wafer 30 in the bonded substrate is reduced by mechanical grinding and subsequent chemical-mechanical polishing or chemical etching in order to form an active layer 30a having a suitable thickness above the bonding plane 52. The thickness of the active layer 30a should be accurate and uniform over the whole area since the thickness of the active layer seriously affects the characteristics of semiconductor devices fabricated in and on the active layer. In general, power ICs need an active layer of a large thickness which is tens of micrometers and in some cases reaches 50–70 $\mu$m. In the active layer 30a, trenches 34 having V-shaped cross-sections are formed to define the periphery of a selected region 40 wherein low voltage components of a control circuit are to be fabricated. The trenches 34 reach the buried oxide film 32. A silicon oxide film 36 is formed on the inner walls of the trenches 34, and the trenches 34 are filled with a filler 38 such as polysilicon (polycrystalline silicon). By the oxide films 32 and 36, the region 40 is isolated from another region 42 wherein a high voltage MOSFET is to be fabricated. That is, the low voltage region 40 becomes an island-like region provided with a dielectric isolation structure.

The thickness of a single-crystal silicon layer above a silicon oxide layer can be measured by an optical method. For example, when the thickness of the silicon layer is smaller than about 10 $\mu$m a useful optical method is interference color photometry. In this method, visible light is vertically incident on the silicon surface, and interference of light reflected from the silicon surface, and from the interface between the silicon layer, and the oxide layer is analyzed to determine the thickness of the silicon layer. However, as the thickniess of the silicon layer becomes larger the intensity of reflected light diminishes so that the thickness measurement becomes difficult, since there is a limit to the depth of penetration of visible light into a single-crystal silicon layer. Therefore, when the thickness of the silicon layer is larger than about 10 $\mu$m it is usual to use infrared rays to which single-crystal silicon is transparent. More particularly, Fourier transform infrared spectroscopy (FT-IR) is used. FT-IR can be used whether the thickness of the silicon layer is larger than 10 $\mu$m or smaller than 10 $\mu$m.

In producing a bonded SOI substrate in which an oxide film is buried in the whole area of the substrate, the thickness of the active layer above the oxide film is examined by an optical measurement method to determine the extent of the final polishing of the wafer which provides the active layer. That is, the polishing operation and the thickness measurement are alternately repeated until the thickness of the active reaches a predetermined value.

However, in the ease of producing a bonded SOI substrate in which an oxide film is buried in a plurality of small areas, it is not easy to measure the thickness of the active layer because it is difficult to accurately detect the location of a small area wherein the oxide film is buried by observation from the substrate surface. In using FT-IR to measure the thickness of the active layer, it is necessary to irradiate the active layer and the underlying oxide film with infrared rays over an area not smaller than about 30 mm$^2$. However, when the size of the individual chips to be fabricated in the bonded substrate is smaller than this minimum area, the thickness of the active layer cannot be measured since the oxide film does not have an area necessary for the measurement.

To realize a desired thickness of an active layer in a bonded SOI substrate without need of measuring the thickness, there are some proposals of burying relatively hard structures having a predetermined thickness or depth, such as trenches in which an oxide film is deposited, in the wafer which provides the active layer in order to use the buried structures as polishing stoppers. For example, JP-A 2-219265 shows a method illustrated in FIGS. 5(A) to 5(C) of the accompanying drawings. As shown in FIG. 5(A), in a surface of a first silicon wafer 60 a group of trenches 62 of uniform depth are formed in a lattice-like pattern. A silicon oxide film 64 is deposited on the wafer surfaces including the bottom and wall faces in the trenches 62. Then, as shown in FIG. 5(B), the first wafer 60 is bonded to a second silicon wafer 70 such that the openings of the trenches 62 are closed by the second wafer 70. Next, the thickness of the first wafer 60 is reduced by grinding so as to leave a small thickness above the bottom of the trenches 62. The silicon layer remaining above the bottom of the trenches 62 is removed by chemical-mechanical polishing. When the oxide film 64 at the bottom of the trenches 62 is exposed as shown in FIG. 5(C), the polishing automatically stops since the oxide film 64 is far stronger in resistance to chemical-mechanical polishing than silicon. As a result, an active layer 60a uniformly having a predetermined thickness is formed above the oxide film 64 adjacent to the bonding plane 72. The active layer 60a is divided into a plurality of regions by the oxide film 64 on the inner wall faces of the trenches 62. In this method it is optional to fill the void space in each trench 62 with polysilicon or a different filler.

The method illustrated in FIGS. 5(A) to 5(C) can be applied to the production of a bonded SOI substrate having island-like regions provided with a dielectric isolation structure. For example, JP-A 3-142952 shows a bonded substrate which is shown in FIG. 6 of the accompanying drawings. First and second silicon wafers 80 and 90 are bonded together. Prior to the bonding, trenches 82 having V-shaped cross-sections and a depression 84 are formed in the first wafer 80 to define a region 100 for low voltage devices and another region 102 for high voltage devices. A silicon oxide film 86 is deposited on the inner wall faces of the trenches 82 and the bottom of the depression 84, and the void spaces in the trenches and the depression are filled with polysilicon 88. When the thickness of the first wafer 80 is reduced by grinding and subsequent chemical-mechanical polishing to the extent of exposing the bottom of the trenches 82 as shown in FIG. 6, the polishing is terminated.

The method illustrated in FIGS. 5(A) to 5(C) and FIG. 6 includes complicated process steps and entails an increased cost of production because of forming trenches in one of the two wafers to be bonded together. Besides, in the case of producing a bonded SOI substrate in which an active layer has a thickness larger than about 50 μm, it is difficult to form sufficiently deep trenches with good uniformity and accuracy of depth.

SUMMARY OF THE INVENTION

It is an object of the present invention to provide a bonded SOI substrate which is simple in structure and in which a desired thickness of an active layer can easily and accurately be realized.

It is another object of the invention to provide a method of producing a bonded SOI substrate according to the invention by relatively simple process steps and at relatively low cost.

Essentially, a bonded SOI substrate according to the invention comprises first and second single-crystal substrates which are bonded to each other such that a principal surface of the first silicon substrate makes contact with a principal surface of the second silicon wafer, and at least one first insulator film pattern, which is formed In the above-mentioned surface of the first silicon substrate, is buried in the bonded substrate for isolation of at least one semiconductor device to be fabricated on the bonded substrate, and at least one second insulator film pattern, which is formed in the above-mentioned surface of the first silicon substrate, is buried in the bonded substrate for optical measurement of the thickness of an active layer of silicon. The first and second insulator film patterns are of equal thickness.

In an ebodiment of the Invention, two single-crystal silicon wafers are used as the first and second substrates, and a plurality of first insulator film patterns and at least two second insulator are formed in the first wafer.

Usually the first and second insulator film patterns are silicon oxide layers, but alternatively they may be silicon nitride film patterns.

A method according to the invention for producing a bonded SOI substrate comprises the steps of (a) forming a plurality of first insulator film patterns of equal thickness in selected areas of a principal surface of a first single-crystal silicon wafer for isolation of semiconductor devices to be fabricated an the bonded substrate and simultaneously forming at least two second insulator film patterns in other selected areas of the same surface of the first wafer for optical measurement of the thickness of an active layer in the bonded substrate, (b) after step (a) bonding the first wafer to a second single-crystal silicon wafer to obtain a bonded substrate in which the above-mentioned principal surface of the first wafer makes contact with a principal surface of the second wafer and subjecting the bonded substrate to a heat treatment to enhance the strength of bond between the first and second wafers, (c) grinding the first wafer in the bonded substrate to reduce the thickness of the first wafer to a predetermined extent, and (d) after step (c) intermittently polishing the first wafer to further decrease the thickness of the first wafer until an active layer of silicon having a predetermined thickness is formed above the first and second insulator film patterns and optically measuring the thickness of a silicon layer above each of the second insulator film patterns while the polishing operation is intermitted.

In this method the first insulator film patterns for device isolation and the second insulator film patterns for thickness measurement are formed simultaneously by a single patterning process. There is no need of forming trenches or the like to determine the thickness of an active layer in the bonded substrate since the thickness can be measured in selected areas where the second insulator film patterns exist. Therefore, the bonded SOI substrate can be produced by relatively simple process steps and at relatively low cost.

Each of the second insulator film patterns can have a sufficiently large area so that the thickness of the active layer can be measured by an optical method such as FT-IR irrespective of the size of the first insulator patterns for device isolation. A plurality of second insulator film patterns can be orderly distributed in a principal surface of the first wafer so that dispersions of the thickness of the active layer can be detected to correct the deviations by adjusting the polishing conditions. Accordingly, the uniformity of the thickness of the active layer can be improved. Also it is possible to form one of the second insulator film patterns along the periphery of the first wafer in view of the fact that a periphery region of the wafer is not used for the fabrication of devices. By so utilizing a peripheral region of the wafer, it is possible to provide the second insulator films for thickness measurement with a minimal decrease in areas useful for the fabrication of devices.

Bonded SOI substrates according to the invention are useful for various ICs and also for intelligent power devices (IPD) in which high voltage power devices such as MOS-FETs of the vertical type and low voltage devices such as CMOS or bipolar integrated circuits coexist.

DESCRIPTION OF THE PREFERRED EMBODIMENTS

Figure 1:
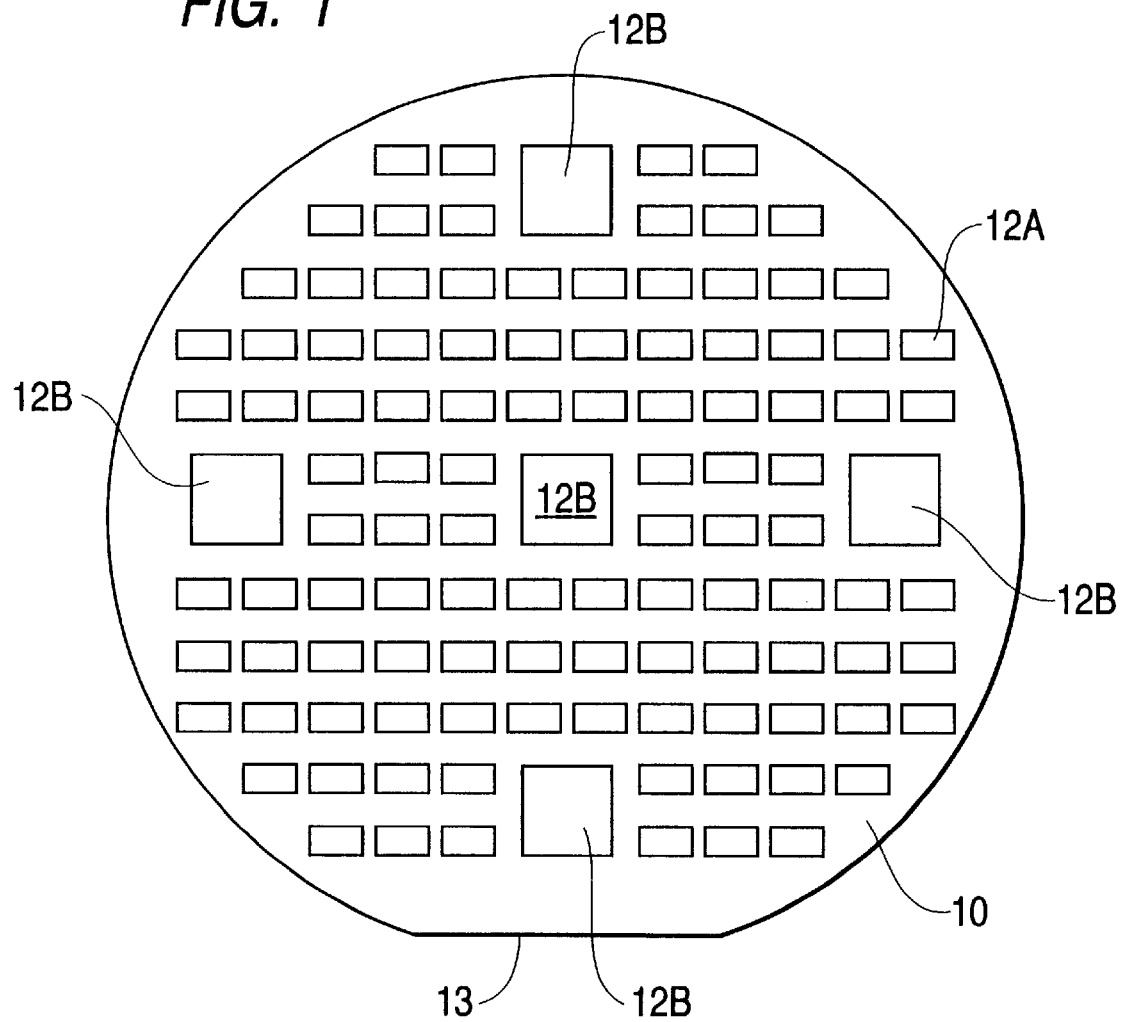
FIG. 1 is a schematic plan view of a silicon wafer used in an example of the invention and shows the arrangement of oxide film patterns formed in the wafer surface.

FIG. 1 shows an example of various arrangements of the insulator film patterns in bonded substrates according to the invention. The insulator films, indicated at 12A and 12B, are formed in a principal surface of a single-crystal silicon wafer 10 which is to be bonded to another single-crystal silicon wafer. The wafer 10 has a flat 13 for positioning and orientating purposes. In the wafer surface there are a large number of insulator film patterns 12A for isolation of semiconductor devices to be fabricated on the bonded substrate and, in addition, five insulator patterns 12B for measurement of the thickness of an active layer in the bonded substrate.

The insulator film patterns 12A for device isolation are orderly arranged and distributed over nearly the whole area of the wafer surface such that the wafer 10 can be cut into many chips each of which contains one of these insulator film patterns 12A. For example, the patterns 12A are rectangular patterns 2 mm in length and 1 mm in width.

The insulator film patterns 12B for thickness measurement are wider in individual pattern areas than the insulator film patterns 12A. A plurality of (five in this example) insulator film patterns 12B for thickness measurement are formed for the purpose of accurately examining dispersions of the thickness of the active layer in the whole area of the bonded substrate. One of the five insulator film patterns 12B is in the center of the wafer 10, and the other four patterns 12B are positioned relatively close to the periphery of the wafer 10. In this example, the four patterns 12B in question are at equal distances from the center of the wafer 10 and at equal angular intervals. The arrangement of the insulator film patterns 12B for thickness measurement is variable, but in any case it is desirable that the patterns 12B are evenly distributed in the wafer surface. For example, the patterns 12B are 6 mm×6 mm square patterns.

FIGS. 2(A) to 2(E) illustrate a process of producing a bonded substrate according to the invention by using two single-crystal silicon wafers 10 and 20 with the crystal surface in the <100> orientation. For example, the wafers 10 and 20 are 5 inches in diameter.

Figure 2A:
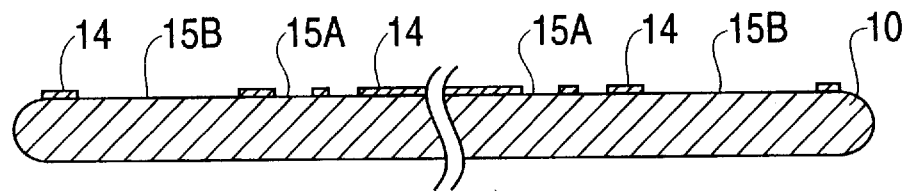
FIGS. 2(A) to 2(E) illustrate, in schematic cross-sectional views, a process of producing a bonded substrate according to the invention in which the oxide film patterns of FIG. 1 are buried.

Referring to FIG. 2(A), first a silicon oxide film (14) is formed over the whole area of a principal surface of the first silicon wafer 10 by a suitable method such as thermal oxidation. Then the silicon oxide film 14 is removed in selected areas by photo-lithography and dry etching to provide a large number of narrow openings 15A and several (five in the example shown in FIG. 1) relatively wide openings 15B.

Figure 2B:
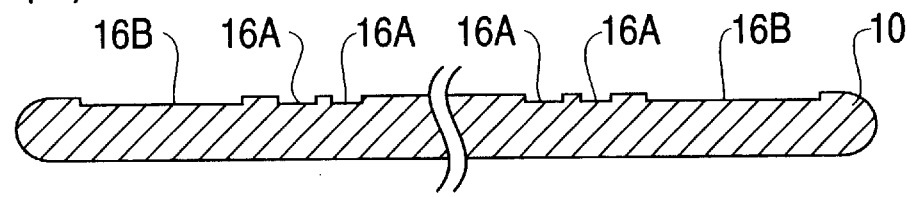

Referring to FIG. 2(B), using the silicon oxide film 14 remaining as shown in FIG. 2(A), the single-crystal silicon surface exposed in the openings 15A, 15B is etched, for example, by dry etching to form shallow depressions 16A and 16B in the openings 15A and 15B, respectively. After etching the remaining silicon oxide film 14 is removed. The depth of the depressions 16A is determined according to the characteristics of semiconductor devices to be fabricated on the bonded substrate, and the depressions 16B have the sane depth as the depressions 16A. For example, the depth of the depressions 16A, 16B is about 1 $\mu$m.

Figure 2C:
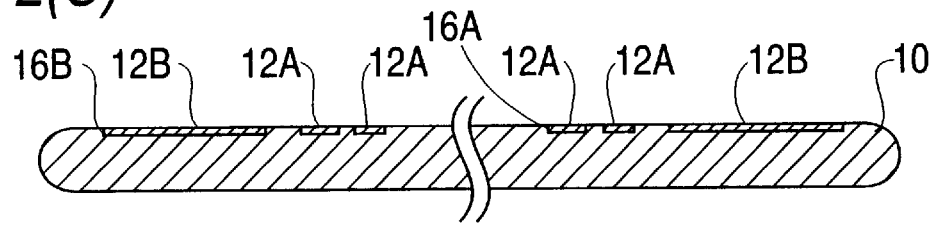

Referring to FIG. 2(C), a silicon oxide film (not shown) is deposited, for example, by a low-temperature CVD process over the whole area of the wafer surface to completely fill the depressions 16A, 16B with the deposited oxide. Then the oxide film is ground and polished to such an extent that the oxide film remains only in the depressions 16A and 16B and becomes coplanar with the exposed silicon surface of the wafer 10. The oxide film remaining in the openings 16A serves as the insulator film patterns 12A for device isolation, and the oxide film in the openings 16B as the insulator film patterns 12B for thickness measurement.

Thus, the two groups of insulator film patterns 12A and 12B are formed simultaneously by using only one patterning process described with reference to FIG. 2(A).

Figure 2D:
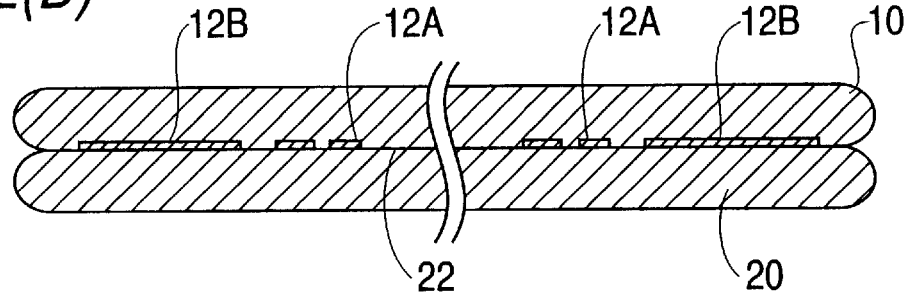

FIG. 2(D) shows bonding the second silicon wafer 20 to the first silicon wafer 10 in the state of FIG. 2(C). A polished principal surface of the second wafer 20 is brought into direct contact with the polished surface of the first wafer 10 in which the oxide film patterns 12A, 12B are formed. The bonding of the two wafers 10 and 20 is accomplished by a known method which does not need to use any adhesive. That is, the bonding surface of each wafer 10, 20 is thoroughly cleaned and rendered hydrophilic by treating with a suitable liquid such as a mixture of an acid and hydrogen peroxide, and after drying the treated wafer surfaces are brought into tight contact with each other. After that, the strength of bond between the two wafers is augmented by a suitable heat treatment such as heating in an oxidizing atmosphere at a temperature of 1100–1200° C. for about 2 h.

As a result, the oxide film patterns 12A, 12B on the first wafer 10 is buried in the unitary assembly of the two wafers 10 and 20 at the interface between the two wafers 10 and 20.

Figure 2E:
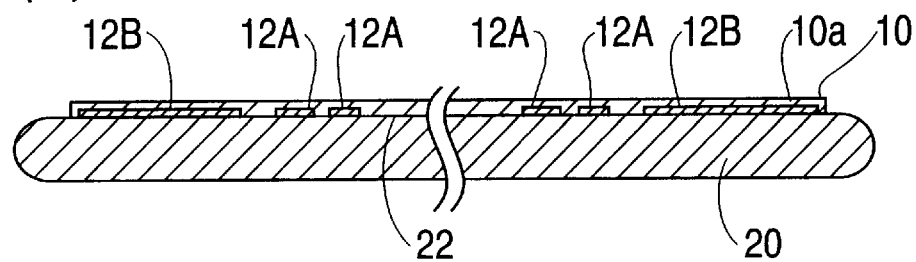

Referring to FIG. 2(E), after bonding the two silicon wafers 10 and 20 together, the thickness of the first wafer 10 is reduced until the thickness of an active layer of silicon 10a above the oxide film patterns 12A, 12B reaches a desired value. The first step of the thickness reduction process is mechanically grinding the first wafer 10. For example, the grinding may be performed until the thickness of the wafer 10 is reduced to about 15 $\mu$m. the next (and final) step is chemical-mechanical polishing of the remaining layer of the wafer 10 (active layer 10a). The polishing operation uses a polishing slurry containing abrasive grains such as fine particles of silicon dioxide dispersed in a liquid medium such as a solution of sodium hydroxide. The polishing operation is intermitted at suitable time intervals to measure the thickness of the active layer 10a above each of the oxide film patterns 12B by an optical method. When the thickness of the active layer 10a is greater than about 10 $\mu$m, FT-IR is useful as the optical measurement method. When the thickness is smaller than about 10 $\mu$m, either interference color photometry or FT-IR can be used. For positioning the light source for the thickness measurement with respect to each of the oxide film patterns 12B, the flat 13 of the wafers 10, 20 is used. By alternately repeating the polishing operation and the thickness measurement it is possible to accurately realize a desired thickness of the active layer 10a in the bonded substrate.

On the bonded substrate shown in FIG. 2(E), an oxide film (not shown) will remain as a result of the heat treatment in the wafer bonding process. That oxide film is resolved, for example, by etching with diluted hydrofluoric acid.

Alternative to the process described with reference to FIGS. 2(A) to 2(C). it is possible to use a LOCOS (local oxidation of silicon) technique to form the oxide film patterns 12A, 12B on the first silicon wafer 10.

Figure 3:
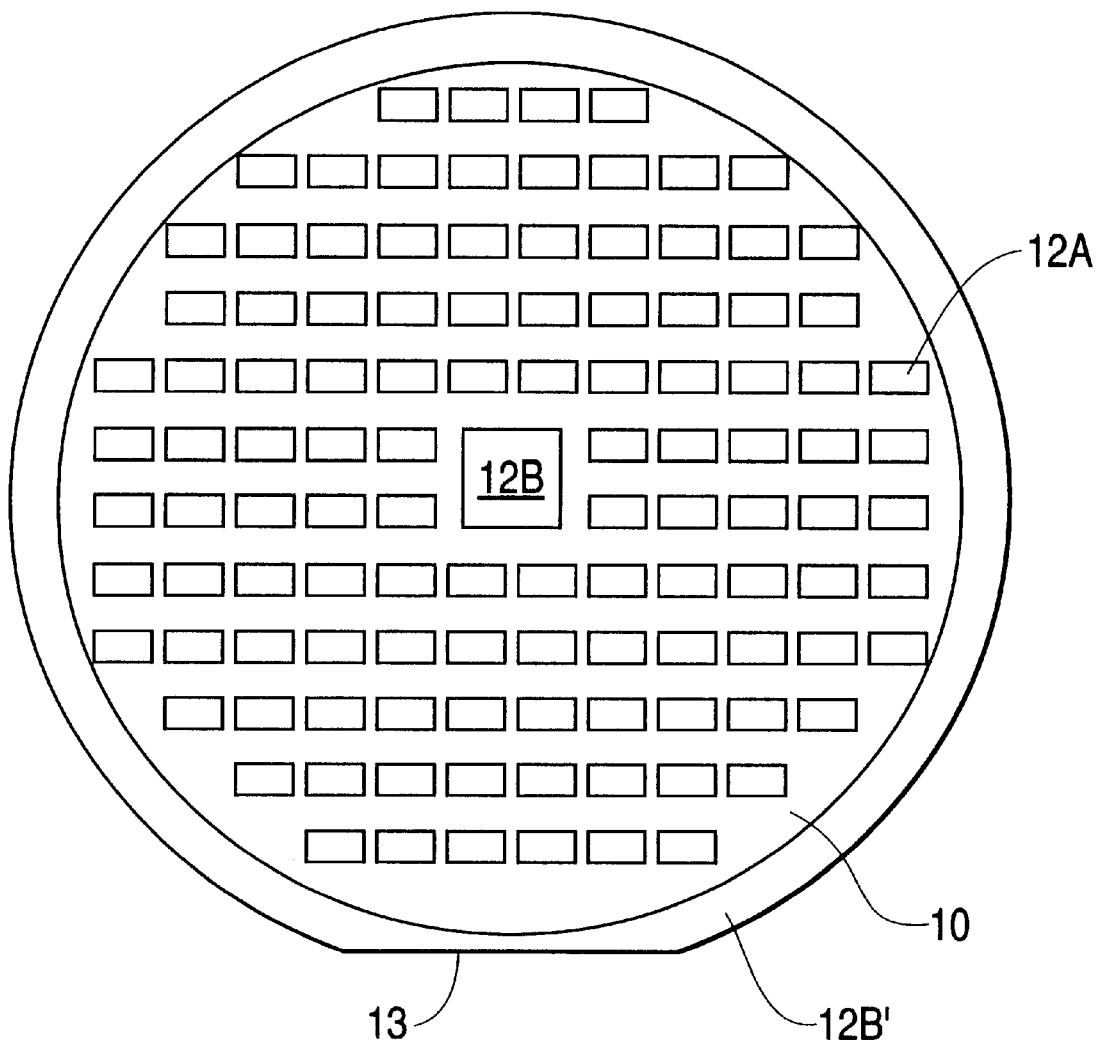
FIG. 3 shows a modification of the arrangement of oxide film patterns shown in FIG. 1.
Figure 4:
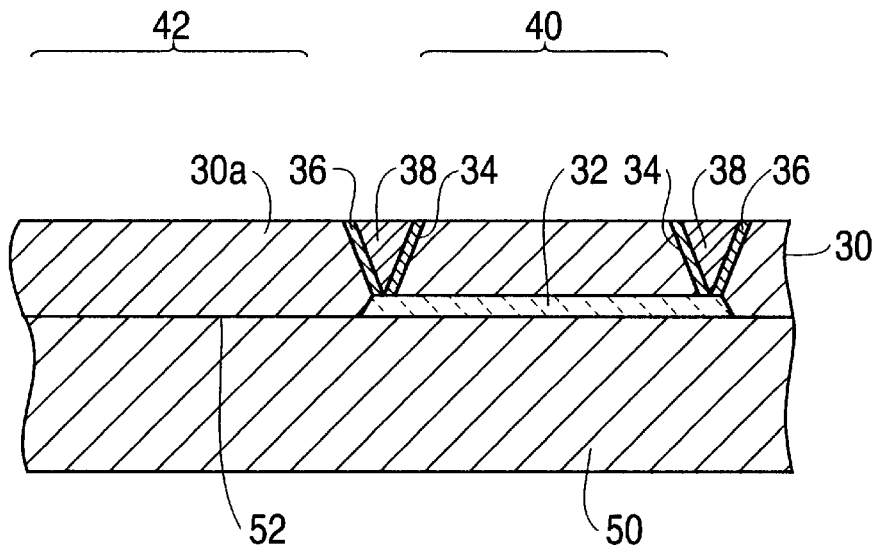
FIG. 4 is a schematic cross-sectional view of a known bonded substrate having a local SOI structure.
Figure 6:
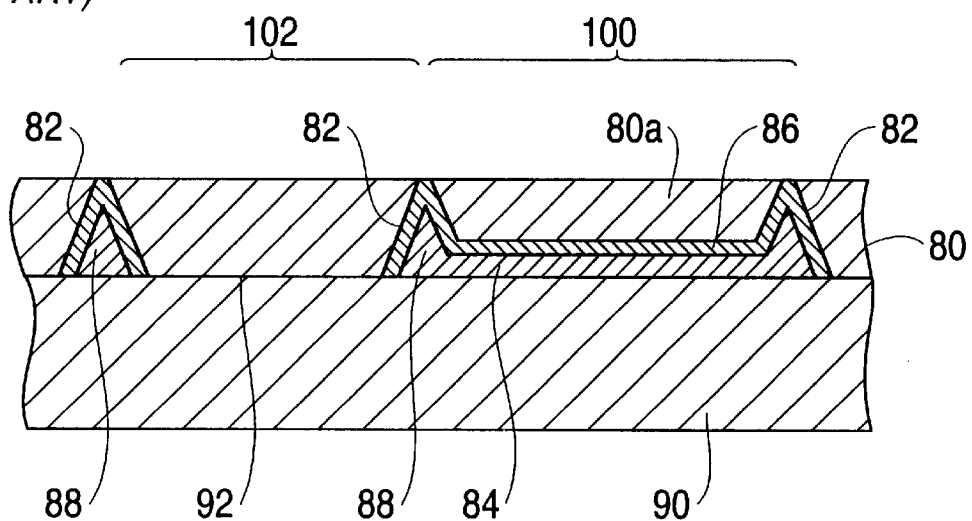
FIG. 6 is a schematic cross-sectional view of another known bonded substrate having a local SOI structure.
Figure 5A:
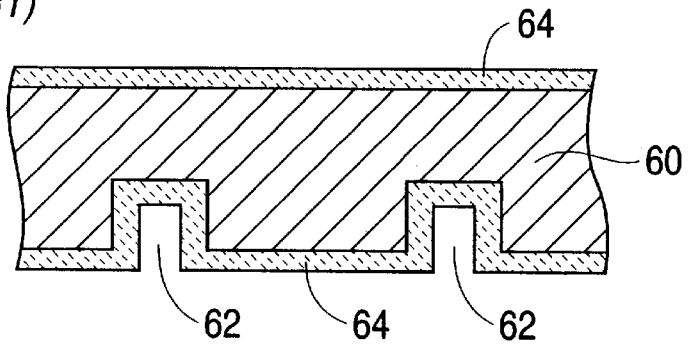
FIGS. 5(A) to 5(C) illustrate, in schematic cross-sectional views, a known process of producing a bonded substrate having an SOI structure.
Figure 5B:
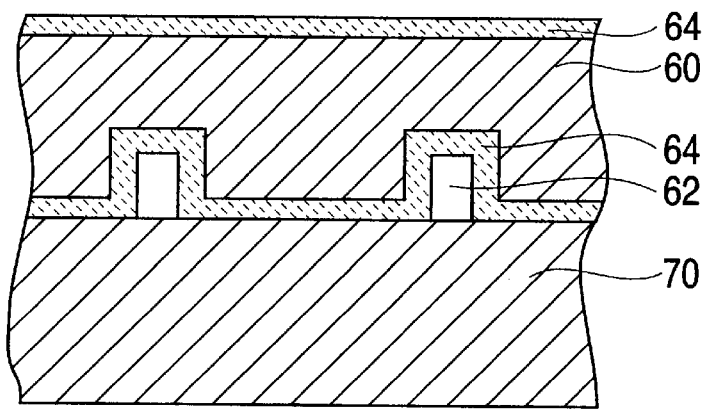
Figure 5C:
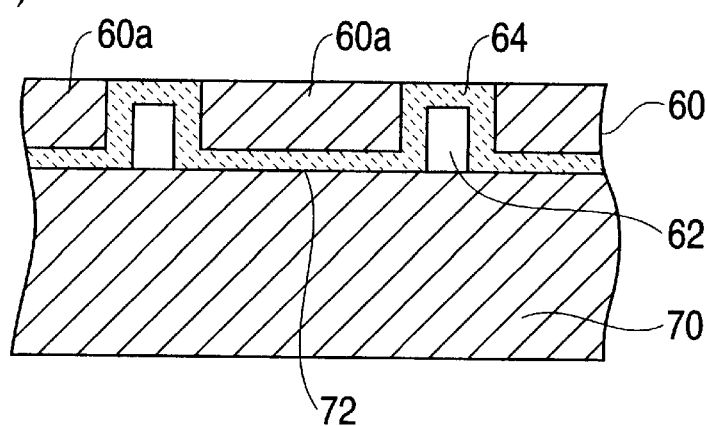

FIG. 3 shows another example of possible arrangements of the oxide film patterns 12A, 12B in a principal surface of the first silicon wafer 10. In this example the arrangement of the oxide film patterns 12A for device isolation is substantially similar to that in FIG. 1. In this example, there are two oxide film patterns 12B and 12B' for thickness measurement. The pattern 12B is a square pattern (for example, 6 mm×6 mm) in the center of the wafer surface, and the other pattern 12B' is an annular pattern which is contiguous to the perimeter of the wafer surface. For example, the annular pattern 12B' has a width of 6 mm. The oxide film patterns 12A, 12B, 12B' in FIG. 3 can be formed by the process illustrated in FIGS. 2(A) to 2(C).

In the wafer 10 in FIG. 3 the annular pattern 12B' exists in a peripheral region which is not used for the fabrication of devices. Therefore, compared with the arrangement in FIG. 1, a larger area can be used for forming the oxide film patterns 12A for device isolation. Besides, it is possible to measure the thickness of the active layer at any number of arbitrarily chosen points in the peripheral region of the bonded substrate without need of repeating the adjustment of the position of the substrate relative to the light source. Therefore, it is possible to obtain detailed information about dispersions of the thickness of the active layer, and the obtained information can be used for determining optimum conditions of the polishing operation.

What is claimed is:

1. A method of producing a bonded substrate, comprising the steps of:

(a) forming a plurality of first insulator film patterns of equal thickness in selected areas of a principal surface of a first wafer, and simultaneously forming at least two second insulator film patterns in other selected areas of said surface of the first wafer for optical measurement of the thickness of an active layer in the bonded substrate; and wherein
        at least one of said second film patterns is larger in area than at least one of said first patterns;

(b) bonding the first silicon wafer to a second wafer to obtain a bonded substrate in which said principal surface of the first wafer makes contact with a principal surface of the second wafer;

(c) grinding the first wafer in the bonded substrate to reduce the thickness of the first wafer; and (d) intermittently polishing the first wafer to further decrease the thickness of the first wafer until an active layer having a predetermined thickness is formed above said first and second insulator film patterns, and optically measuring the thickness of a layer above each of said second insulator film patterns while the polishing operation is intermitted.

2. A method according to claim 1, wherein step (a) comprises the sub-steps of (i) forming a plurality of first depressions of uniform depth in said selected areas of said surface of the first wafer and simultaneously forming at least two second depressions having the same depth as said first depressions in said other selected areas of said surface of the first wafer, (ii) depositing an insulator film on said surface of the first wafer to fill said first and second depressions with the deposited insulator, and (iii) removing the insulator film to such an extent that the deposited insulator remains only in said first and second depressions.

3. A method according to claim 1, wherein said at least two second insulator film patterns are orderly distributed in said surface of the first wafer.

4. A method according to claim 3, wherein one of said at least two second insulator film patterns is formed in a central region of said surface of the first wafer.

5. A method according to claim 1, wherein said at least two second insulator film patterns comprise a pattern which is formed in a central region of said surface of the first wafer and another pattern which is formed along the perimeter of said surface of the first wafer.

6. A method of producing a bonded silicon-on-insulator substrate, comprising the steps of:

(a) forming a plurality of first insulator film patterns of equal thickness in selected areas of a principal surface of a first single-crystal silicon wafer for isolation of semiconductor devices to be fabricated on the bonded substrate, and simultaneously forming at least two second insulator film patterns in other selected areas of said surface of the first silicon wafer for optical measurement of the thickness of an active layer in the bonded substrate,
        wherein each of said second insulator film patterns is larger in area than each of said first insulator film patterns;

(b) bonding the first silicon wafer to a second single-crystal silicon wafer to obtain a bonded substrate in which said principal surface of the first silicon wafer makes contact with a principal surface of the second silicon wafer;

(c) grinding the first silicon wafer in the bonded substrate to reduce the thickness of the first silicon wafer; and (d) intermittently polishing the first silicon wafer to further decrease the thickness of the first silicon wafer until an active layer of silicon having a predetermined thickness is formed above said first and second insulator film patterns, and optically measuring the thickness of a silicon layer above each of said second insulator film patterns while the polishing operation is intermitted.

7. A method according to claim 1, wherein both said first insulator film patterns and said second insulator film patterns are silicon oxide film patterns.

8. A method according to claim 1, wherein both said first insulator film patterns and said second insulator film patterns are silicon nitride film patterns.

9. A method as recited in claim 1, wherein said bonded substrate is at least a portion of an integrated circuit.

10. A method as recited in claim 1, wherein said bonded substrate is at least a portion of an intelligent power device.

11. A method as recited in claim 1, wherein said bonded substrate comprises:
    a MOSFET device of a vertical type, together with
    a low voltage device selected from one of a CMOS device and a bipolar integrated circuit.

12. A method as recited in claim 6, wherein said bonded silicon-on-insulator substrate is at least a portion of an integrated circuit.

13. A method as recited in claim 6, wherein said bonded silicon-on-insulator substrate is at least a portion of an intelligent power device.

14. A method as recited in claim 6, wherein said bonded silicon-on-insulator substrate comprises:
    a MOSFET device of a vertical type, together with
    a low voltage device selected from one of a CMOS device and a bipolar integrated circuit.

15. A method of producing a bonded substrate, comprising the steps of:

(a) forming a plurality of first film patterns in a plurality of selected areas of a principal surface of a first wafer, and simultaneously
    forming a plurality of second film patterns in a plurality of other selected areas of said principal surface of said first wafer, wherein
        at least one of said plurality of second film patterns is to be utilized for an optical measurement of a thickness of an active layer in said bonded substrate; and wherein
            said at least one of said second film patterns is larger in area than at least one of said first patterns, and wherein
            said first wafer has a first thickness, (b) bonding said first wafer to a second wafer to obtain said bonded substrate wherein said principal surface of said first wafer makes contact with a principal surface of said second wafer, and (c) forming an active layer having a second thickness above said first and second film patterns, by iteratively
(i) reducing said first thickness of said first wafer, and
(ii) optically measuring said thickness of said active layer above said at least one of said second film patterns.

16. A method as recited in claim 15, wherein said reducing said first thickness of said first wafer comprises:
(i) grinding said first wafer to reduce said first thickness of said first wafer; and then
(ii) polishing said first wafer to further decrease said first thickness of said first wafer until said active layer having said second thickness is formed above said first and second insulator film patterns.

17. A method as recited in claim 15, wherein each of said second film patterns is larger in area than at least one of said first patterns.

18. A method as recited in claim 15, wherein each of said second film patterns is larger in area than each of said first patterns.

19. A method as recited in claim 15, wherein each of said plurality of second film patterns is to be utilized for an optical measurement of a thickness of an active layer in said bonded substrate.

20. A method as recited in claim 15, wherein
said bonded substrate comprises a bonded silicon-on-insulator substrate,
said first and second wafers each comprise a single-crystal silicon wafer,
said plurality of first film patterns are insulator film patterns of equal thickness, to be utilized for isolation of semiconductor devices to be fabricated on the bonded substrate, and
said active layer is comprised of silicon.

21. A method as recited in claim 20, wherein forming said plurality of first and second film patterns in said first wafer utilizes a local oxidation of silicon (LOCOS) technique.

22. A method as recited in claim 20, wherein forming said plurality of first and second film patterns in said first wafer comprises utilizing a low temperature CVD process, and then utilizing a grinding and polishing technique.

23. A method of producing a bonded substrate as recited in claim 1, wherein
the bonding step (b) further comprises subjecting the bonded substrate to a heat treatment to enhance the strength of the bond between said first and second silicon wafers.

24. A method of producing a bonded substrate as recited in claim 6, wherein
the bonding step (b) further comprises subjecting the bonded substrate to a heat treatment to enhance the strength of the bond between said first and second silicon wafers.

25. A method as recited in claim 6, wherein step (a) comprises the sub-steps of
(i) forming a plurality of first depressions of uniform depth in said selected areas of said surface of the first wafer and simultaneously forming at least two second depressions having the same depth as said first depressions in said other selected areas of said surface of the first wafer,
(ii) depositing an insulator film on said surface of the first wafer to fill said first and second depressions with the deposited insulator, and
(iii) removing the insulator film to such an extent that the deposited insulator remains only in said first and second depressions.

26. A method as recited in claim 6, wherein said at least two second insulator film patterns are orderly distributed in said surface of the first wafer.

27. A method as recited in claim 26, wherein one of said at least two second insulator film patterns is formed in a central region of said surface of the first wafer.

28. A method as recited in claim 6, wherein said at least two second insulator film patterns comprise a pattern which is formed in a central region of said surface of the first wafer and another pattern which is formed along the perimeter of said surface of the first wafer.

29. A method as recited in claim 6, wherein both said first insulator film patterns and said second insulator film patterns are silicon oxide film patterns.

30. A method as recited in claim 6, wherein both said first insulator film patterns and said second insulator film patterns are silicon nitride film patterns.

* * * * *